US011248115B2

(12) United States Patent
Aarnio-Winterhof et al.

(10) Patent No.: US 11,248,115 B2
(45) Date of Patent: Feb. 15, 2022

(54) POLYPROPYLENE COMPOSITION WITH FLAME RETARDANT ACTIVITY

(71) Applicant: BOREALIS AG, Vienna (AT)

(72) Inventors: Minna Aarnio-Winterhof, Altenberg (AT); Martina Sandholzer, Linz (AT); Klaus Bernreitner, Linz (AT)

(73) Assignee: BOREALIS AG, Vienna (AT)

( * ) Notice: Subject to any disclaimer, the term of this patent is extended or adjusted under 35 U.S.C. 154(b) by 0 days.

(21) Appl. No.: 16/323,748

(22) PCT Filed: Aug. 9, 2017

(86) PCT No.: PCT/EP2017/070171
§ 371 (c)(1),
(2) Date: Feb. 6, 2019

(87) PCT Pub. No.: WO2018/029243
PCT Pub. Date: Feb. 15, 2018

(65) Prior Publication Data
US 2019/0177520 A1    Jun. 13, 2019

(30) Foreign Application Priority Data

Aug. 11, 2016  (EP) .................................... 16183785

(51) Int. Cl.
| | | |
|---|---|---|
| C08L 23/14 | (2006.01) | |
| B32B 27/32 | (2006.01) | |
| C08K 3/32 | (2006.01) | |
| H01L 31/049 | (2014.01) | |
| H01L 31/048 | (2014.01) | |
| B32B 27/18 | (2006.01) | |
| B32B 7/12 | (2006.01) | |
| B32B 27/20 | (2006.01) | |
| C08K 3/01 | (2018.01) | |
| B32B 27/08 | (2006.01) | |
| C08K 3/34 | (2006.01) | |
| C08K 5/5313 | (2006.01) | |
| C08F 210/06 | (2006.01) | |
| C08K 3/40 | (2006.01) | |
| C08K 7/14 | (2006.01) | |

(52) U.S. Cl.
CPC .............. *C08L 23/14* (2013.01); *B32B 7/12* (2013.01); *B32B 27/08* (2013.01); *B32B 27/18* (2013.01); *B32B 27/20* (2013.01); *B32B 27/32* (2013.01); *C08F 210/06* (2013.01); *C08K 3/01* (2018.01); *C08K 3/32* (2013.01); *C08K 3/34* (2013.01); *C08K 3/346* (2013.01); *C08K 3/40* (2013.01); *C08K 5/5313* (2013.01); *C08K 7/14* (2013.01); *H01L 31/049* (2014.12); *H01L 31/0481* (2013.01); *B32B 2262/101* (2013.01); *B32B 2264/10* (2013.01); *B32B 2307/304* (2013.01); *B32B 2307/308* (2013.01); *B32B 2307/3065* (2013.01); *B32B 2307/546* (2013.01); *B32B 2307/732* (2013.01); *B32B 2307/734* (2013.01); *B32B 2457/12* (2013.01); *C08K 2003/343* (2013.01); *C08K 2201/014* (2013.01); *C08L 2201/02* (2013.01); *C08L 2203/204* (2013.01); *C08L 2205/025* (2013.01); *C08L 2207/02* (2013.01)

(58) Field of Classification Search
CPC ......... C08K 3/32; C08K 5/5313; C08L 23/12; C08L 23/116
See application file for complete search history.

(56) References Cited

U.S. PATENT DOCUMENTS

| | | |
|---|---|---|
| 4,107,414 A | 8/1978 | Giannini et al. |
| 4,186,107 A | 1/1980 | Wagner |
| 4,226,963 A | 10/1980 | Giannini et al. |
| 4,347,160 A | 8/1982 | Epstein et al. |
| 4,382,019 A | 5/1983 | Greco |
| 4,435,550 A | 3/1984 | Ueno et al. |
| 4,465,782 A | 8/1984 | McKenzie |
| 4,472,524 A | 9/1984 | Albizzati |
| 4,473,660 A | 9/1984 | Albizzati et al. |
| 4,522,930 A | 6/1985 | Albizzati et al. |
| 4,530,912 A | 7/1985 | Pullukat et al. |
| 4,532,313 A | 7/1985 | Matlack |
| 4,560,671 A | 12/1985 | Gross et al. |
| 4,581,342 A | 4/1986 | Johnson et al. |
| 4,657,882 A | 4/1987 | Karayannis et al. |
| 5,539,067 A | 7/1996 | Parodi et al. |
| 5,618,771 A | 4/1997 | Parodi et al. |

(Continued)

FOREIGN PATENT DOCUMENTS

| | | | |
|---|---|---|---|
| CN | 103351532 A | | 10/2013 |
| CN | 104693604 A | * | 6/2015 |

(Continued)

OTHER PUBLICATIONS

Cabot (Plasblak UN2014 Black Masterbatch, Mar. 2016, 2 pages).*
SK Corporation (MSDS of Yuplene B391G, 2019, 3 pages).*
SK Corporation (Product Data Sheet of Yuplene B391G, 2019, 1 page).*
YaoSuliao (B291G/Korea SK, Yao Suliao, Aug. 2017, 2 pages).*
Clariant (Aluminum Diethylphosphinate, Clariant, Mar. 2016, 33 pages).*
Machine translated English language equivalent of CN-104693604-A (Jun. 2015, 12 pages).*
Edward D. Weil: "Flame Retardants, Phosphorus" In: "Kirk-Othmer Encyclopedia of Chemical Technology, vol. 11", Oct. 18, 2001 (Oct. 18, 2001).

(Continued)

*Primary Examiner* — Brieann R Johnston
(74) *Attorney, Agent, or Firm* — Tarolli, Sundheim, Covell & Tummino LLP

(57) ABSTRACT

The present invention relates to a polymer composition with flame retardant activity, to a use of the polymer composition for producing an article, to an article comprising the polymer composition, preferably to an article which comprises a layer element comprising at least one layer which comprises the polymer composition.

10 Claims, 1 Drawing Sheet

(56) References Cited

U.S. PATENT DOCUMENTS

| | | | |
|---|---|---|---|
| 8,394,879 B1* | 3/2013 | Bradshaw | C08L 23/10 524/414 |
| 2008/0214715 A1 | 9/2008 | Costanzi | |
| 2012/0261163 A1 | 10/2012 | Tai et al. | |
| 2013/0030093 A1* | 1/2013 | Chen | C08L 67/025 524/101 |
| 2015/0027516 A1* | 1/2015 | Rummens | B32B 27/32 136/251 |
| 2015/0311370 A1* | 10/2015 | Chou | C08L 77/06 136/251 |

FOREIGN PATENT DOCUMENTS

| | | |
|---|---|---|
| CN | 105308115 A | 2/2016 |
| CN | 105462238 A | 4/2016 |
| EP | 0045977 A2 | 2/1982 |
| EP | 0045975 A2 | 3/1982 |
| EP | 0045976 A2 | 3/1982 |
| EP | 491566 A1 | 9/1992 |
| EP | 586390 B1 | 3/1994 |
| EP | 591224 B1 | 2/1998 |
| EP | 2143760 A1 * 1/2010 ........... C08L 23/0815 | |
| EP | 2610271 A1 | 7/2013 |
| TW | 201600329 A | 1/2016 |
| WO | 87/07620 A1 | 12/1987 |
| WO | 92/12182 A1 | 7/1992 |
| WO | 92/19653 A1 | 11/1992 |
| WO | 92/19658 A1 | 11/1992 |
| WO | 92/19659 A1 | 11/1992 |
| WO | 92/21705 A1 | 12/1992 |
| WO | 93/11165 A1 | 6/1993 |
| WO | 93/19100 A1 | 9/1993 |
| WO | 99/24479 A1 | 10/1994 |
| WO | 95/32994 A1 | 12/1995 |
| WO | 97/36939 A1 | 10/1997 |
| WO | 99/24478 A1 | 5/1999 |
| WO | 99/33842 A1 | 7/1999 |
| WO | 00/68315 A1 | 11/2000 |
| WO | 2003/000754 A1 | 1/2003 |
| WO | 2003/000755 A2 | 1/2003 |
| WO | 2003/000756 A1 | 1/2003 |
| WO | 2003/000757 A1 | 1/2003 |
| WO | 2004/029112 A1 | 4/2004 |
| WO | 2004/111095 A1 | 12/2004 |
| WO | 2012/007430 A1 | 1/2012 |
| WO | 2004/000899 A1 | 12/2013 |
| WO | 2014/205802 A1 | 12/2014 |
| WO | 2015/101730 A1 | 7/2015 |
| WO | 2015/173175 A1 | 11/2015 |
| WO | 2017/157484 A1 | 9/2017 |

OTHER PUBLICATIONS

Zhang, et al., "A review of flame retardant polypropylene fibres", Prog. Polym. Sci. 28 (2003) 1517-1538.
Butz, et al., "New Phosphorus based Flame retardants", Society of Plastics, 2015, pp. 887-890.
Office action for Taiwan Patent Application No. 106126829.
Weil, "Flame Retardants, Phosphorus", vol. 11, pp. 484-510.
Zhang, et al., "Flame retarding polyamide 6 with melamine cyanurate and layered silicates", Polym. Adu. Technol , 2008; 19: 928-936.
Office action for India Patent Application No. 201917006513, dated Dec. 20, 2019.
Chinese Office Action dated Sep. 8, 20020.

* cited by examiner

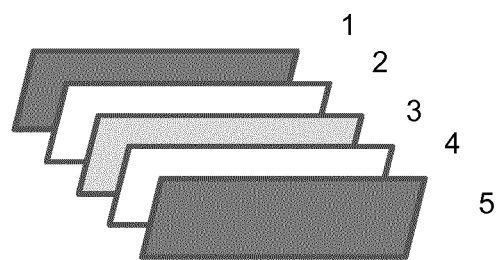

POLYPROPYLENE COMPOSITION WITH FLAME RETARDANT ACTIVITY

The present invention relates to a polymer composition with flame retardant activity, to a use of the polymer composition for producing an article, to an article comprising the polymer composition, preferably to an article which comprises a layer element comprising at least one layer which comprises the polymer composition, preferably to an article which is a photovoltaic module comprising at least one photovoltaic element and at least one layer element of the invention.

BACKGROUND ART

Flame retardant products (FR) are added to manufactured materials, such as plastics and textiles, and surface finishes and coatings that inhibit, suppress, or delay the production of flames to prevent the spread of fire. In many application areas flame retardancy is a requirement or would be desirable due to increasing demands.

Chemically different type of FRs can be used depending on the requirements for the end application. As an example of conventional FRs, e.g. minerals such as aluminium hydroxide, organohalogen compounds and organophosphorus compounds can be mentioned.

FRs may be mixed with the base material (additive flame retardant products) or chemically bonded to the material (reactive flame retardant products). Mineral flame retardant products are typically of additive type while organohalogen and organophosphorus compounds can be either of reactive or of additive type.

Presently there is an increasing interest and demands in different technical fields, for instance in layer elements of various final articles, like layer elements in increasingly growing solar energy field, to provide flame retardant properties to final articles, e.g. photovoltaic (PV) modules.

Photovoltaic modules, also known as solar cell modules, produce electricity from light and are used in various kinds of applications as well known in the field. The type of the photovoltaic module can vary. The modules have typically a multilayer structure, i.e. several different layer elements which have different functions. The layer elements of the photovoltaic module can vary with respect to layer materials and layer structure. The final photovoltaic module can be rigid or flexible.

The above exemplified layer elements can be monolayer or multilayer elements. Moreover, there may be adhesive layer(s) between the layers of an element or between the different layer elements.

Backsheet layer element may contain layer(s) comprising pigment or filler. Backsheet layer element functions typically as an insulation element. However, also photovoltaic modules with conductive backsheet layer element exist, depending on the type of the photovoltaic module.

All said terms have a well-known meaning in the art.

Presently the industry is moving away from halogen containing flame retardant products due to their toxic burning gases. For instance, a monomeric N-alkoxy hindered amine, known as NOR 116 (CAS no 191680-81-6) is a UV stabiliser and also acts as flame retardant product. The drawback of this type of FR is that it needs to be combined with a synergist, to reach effective flame retardancy, for example as described by VTM-0 classification according to UL94 (standard for Safety of Flammability of Plastic Materials for Parts in Devices and Appliances testing).

JP2014139001 A (TOYO METALLISING KK) describes a fire resistant polyolefin film for a backsheet of PV module, wherein the polyolefin film has a three layer structure, layer A/Layer B/Layer C, wherein the layer B has 1~3 wt % of compound of the above mentioned hindered amine type combined with 2~10 wt % a synergist which is an organic phosphate ester type of compound. Layer B may optionally contain inorganic compound particles, preferably of rutile type titanium dioxide particles as described in claim 5, for whitening and light reflect. The drawbacks of this kind of organic phosphate esters are usually poor moisture and wheathering resistance, as well as poor thermal stability.

WO 2013135349 of Renolit describes a polypropylene based coextruded TPO based backsheet layers for PV modules, namely FPP based layers and heat resistant and barrier layers, where the FPP layer can comprise fillers, like glass fibers, to bring tensile strength to the soft polymer material. It is stated that due to relative softness of the layer materials, the stresses on PV cells are reduced, compared to PET based backsheet. Advantageous combinations with VLDPE based encapsulants are described.

Moreover, Polypropylene (PP) polymer may also limit the choice of a flame retardant product for PP based polymer compositions. Namely, PP is not easy to make self-igniting, since it is highly flammable. Therefore, for instance in film and fiber applications, a very effective FR would be needed to enable to use low content (preferably below 10%) of the FR in order not to sacrifice polymer properties and/or processability of the composition (reference is made to S. Zhang, A. R. Horrocks, A review of flame retardant polypropylene fibres, Prog. Polym. Sci 28 (2003) 1517-1538). Accordingly, e.g. $MgOH_2$ is feasible solution for wire and cable layers, but ~60 wt % loading cannot be used for PP based film or fibre.

Another solution for PP is char forming systems (so called intumescent systems) which very often combine the synergistic effects of nitrogen and phosphorus chemistry. WO2014205802 of Dow describes a non-halogen containing, intumescent flame retardant product for a thermoplastic polymer composition for a PV module, which is an APP (ammonium polyphosphate which, as given in the publication, and according to common understanding is regarded organic) based FR. The loading of the FR must be high, at least of 20 wt %, to provide the intumescent effect. However, high FR loadings are undesirable for e.g. film applications. According to claim 2 the composition comprises (A) 10-80 wt % of a thermoplastic polymer, (B) 10-55 wt % of a reinforcing element, (C) 1-30 wt % of a non-halogen containing, intumescent flame retardant, (D) 1-20 wt % of an impact-modifier, (E) 0.001-0.5 wt % of a coupling agent, and, optionally, (F) one or more additives. This intumescent system is most favourably based on organic phrosphorus chemistry (detailed description in pages 10-11). Paragraph 0064 list numerous reinforcing elements, glass fibres being preferred (claim 3).

Moreover, the above mentioned FRs often have the problem that they absorb water (=have high water uptake behaviour) e.g. at outdoor conditions and lose their FR behaviour.

Furthermore, many end articles of polymers, like polymer based layer elements of PV modules, require the polymer composition to have, in addition to flame retardant activity, also good mechanical properties. For instance in case of polymeric layer elements, stiffness of the polymer composition contributes to flatness/planarity and easy-handling of the layer element during the production said element and during the production of a final article thereof, and also contributes to the end use life of the resulted final article.

Many polymeric articles, such as polymeric layer elements of a PV module, require also high mechanical strength, low shrinkage, good thermal stability at very broad temperature range (−40-120° C.) and low thermal expansion behavior of the polymer to meet demanding requirements in some application areas, as for example, thermal cycle test (TCT) standards set for the photovoltaic modules.

Fillers are sometimes used to increase the mechanical properties, like stiffness. However, when fillers are combined with a FR, e.g. halogen-free FR, they can sacrifice the flame retardant activity of the FR. The following articles give concrete examples of such antagonistic effects: 1) V. Butz, J. De Boysère, K. Mitchell, New Phosphorus based Flame retardants, SPE Antec Orlando 2015, conference papers 887-890; 2) J. Zhang, M. Lewin, E. Pearce, M. Zammarano, J. W. Gilman, Flame retarding polyamide 6 with melamine cyanurate and layered silicates, Polym. Adv. Technol., (2008) DOI 10.1002/pat.1063.

Accordingly, it remains challenge to solve the limitations relating to polypropylene based flame retardant end applications. Moreover, for instance, the technology of the photovoltaic modules is still developing considerably and there is a continuous need for different solutions for layer materials to meet the various demands, like flame retardancy together with advantageous mechanical properties, in photovoltaic module field.

FIGURES

FIG. 1 illustrates schematically one example of a photovoltaic module of the invention.

THE DESCRIPTION OF THE INVENTION

Accordingly, the present invention is directed to a polypropylene composition comprising:
(i) more than 30, preferably 40 to 98.5 wt % of a polymer of propylene (PP),
(ii) 1 to 20 wt % of a flame retardant product comprising an inorganic derivative of Phosphor,
(iii) 1 to 30 wt % of a filler,
(iv) 0.2 to 5 wt % of an additive(s) other than the flame retardant product (ii), and
(v) 0 to 30 wt % of a plastomer;
based on the total amount (100 wt %) of the polypropylene composition.

The polypropylene composition of the invention is referred herein also as e.g. "PP composition", "composition" or "composition of the invention". The "(i) polymer of propylene (PP)" is referred herein also as "PP polymer" or "PP polymer (i)". The "(ii) flame retardant product" is referred herein also as "FR" or "flame retardant product (ii)".

Surprisingly, the composition of the invention comprising the inorganic phosphorus based FR and filler provides highly feasible mechanical properties while maintaining an excellent flame retardant behaviour e.g. in terms of UL94 Standard requirements (Standard for Safety of Flammability of Plastic Materials for Parts in Devices and Appliances testing). The highly feasible mechanical properties can be expressed e.g. as tensile properties, flexural modulus, and preferably also as Heat Deflection Temperature (HDT) which indicate for instance good stiffness without sacrificing the toughness and overall strength of the polymer material. Preferable embodiments of the claimed combination of polypropylene together with the FR and filler of the invention make it possible to reach even UL94 VTM-0 (requirement according to UL94 standard). Preferably, the composition has also good weathering resistance (especially low water intake). The composition of the invention with the unexpected property balance is therefore highly suitable for different end applications wherein flame retardancy is required or desired.

For instance during exposure of the PP based composition to flame, an increased degradation of PP polymer often occurs which normally causes dripping, whereby the drops burn, which is undesired. However, in case of the present invention, any drops formed from the degrading composition of the invention do not burn but self-extinguish within seconds during $1^{st}$ and $2^{nd}$ ignition. PP composition of the invention has preferably also an excellent self-ignition even during $3^{rd}$ or longer ignition times (outside UL94 standard scope).

Moreover, the composition of the invention has preferably excellent water protection (i.e. low water vapour transmission rate also called as low water intake behaviour). Accordingly, PP polymer absorbs hardly any water, and this property is very important in many end applications like in layer element(s) of photovoltaic module applications.

The polymer composition may optionally comprise (vi) further polymer(s) other than PP polymer (i) or optional plastomer (v).

The property balance makes the composition of the invention highly feasible for different articles in various end applications wherein flame retardancy together with highly advantageous mechanical properties are desired or required.

Accordingly the invention further provides a use of the polypropylene composition of the invention as defined above or below or in claims for producing an article.

The invention is further directed to an article comprising the polymer composition of the invention, as defined above or below or in claims.

The preferred article comprises a layer element which comprises at least one layer comprising the polymer composition of the invention, as defined above or below or in claims.

Herein the definitions "layer element of the invention comprising (or which comprises) at least one layer comprising (or which comprises) the polymer composition of the invention" and "at least one layer of the layer element of the invention comprising (or which comprises) the polymer composition of the invention" are used herein interchangeably to refer the layer(s) and/or the layer element of the invention, as evident from the context.

In one embodiment the article is a layer element comprising at least one layer which comprises the polymer composition of the invention, as defined above or below or in claims. This embodiment is referred herein also as "layer element" or "layer element comprising at least one layer which comprises the polymer composition" of the invention.

Preferably the layer element is a mono- or multilayer element comprising at least one layer comprising the polymer composition of the invention.

Accordingly, in case the layer element is a monolayer element, then the "at least one" layer, i.e. the monolayer element, comprises the composition of the invention. In case of a multilayer element, the expression "at least one layer" of a layer element means that said element can comprise two or more layers, wherein at least one layer comprises the polymer composition of the invention. The other layer(s) may comprise different layer material(s) or may comprise the polymer composition of the invention. It is evident that the material of the other layers of a multilayer element may vary and can be chosen by a skilled person depending on the desired end application.

Moreover, in another embodiment the article comprises one or more layer elements, wherein at least one layer element is the layer element of the invention. The layer element of the invention is suitable to be combined with other polymeric, preferably other polyolefinic, layer elements. Accordingly, the other layer element(s) may also be the layer element(s) of the invention or be based e.g. other polyolefin based polymer (different from PP polymer) which comprises one or more monomers of ethylene and/or C3-C12-alpha-olefins.

Preferably, said at least one layer of the layer element of the article of the invention comprises at least 70 wt %, preferably at least 80 wt %, preferably at least 90 wt %, preferably 90 to 100 wt %, preferably consists of, the polymer composition of the invention.

Furthermore, the article is preferably a photovoltaic module comprising at least one photovoltaic element and at least one layer element which is the layer element of the invention comprising at least one layer which comprises the polymer composition.

The "photovoltaic element" means that the element has photovoltaic activity. The photovoltaic element can be e.g. an element of photovoltaic cell(s), which has a well-known meaning in the art. Silicon based material, e.g. crystalline silicon, is a non-limiting example of materials used in photovoltaic cell(s). Crystalline silicon material can vary with respect to crystallinity and crystal size, as well known to a skilled person. Alternatively, the photovoltaic element can be a substrate layer on one surface of which a further layer or deposit with photovoltaic activity is subjected, for example a glass layer, wherein on one side thereof an ink material with photovoltaic activity is printed, or a substrate layer on one side thereof a material with photovoltaic activity is deposited. For instance, in well-known thin film solutions of photovoltaic elements e.g. an ink with photovoltaic activity is printed on one side of a substrate, which is typically a glass substrate. Accordingly, the at least one layer of the invention can also be a layer in any layer element of a thin film based photovoltaic module.

The photovoltaic element is most preferably an element of photovoltaic cell(s).

"Photovoltaic cell(s)" means herein a layer element(s) of photovoltaic cells, as explained above, together with connectors.

It is preferred that said at least one layer element of the photovoltaic module of the invention comprising the polymer composition of the invention, as defined above or below or in claims, is a backsheet layer element.

Accordingly, the invention further provides a backsheet layer element of a photovoltaic module which is selected from
  a backsheet monolayer element comprising the polymer composition of the invention, or
  a backsheet multilayer element wherein at least one layer comprises the polymer composition of the invention;
as defined above or below or in claims.

The composition of the invention, the PP polymer, the article, including the at least one layer of the mono- or multilayer element, like backsheet element of a photovoltaic module, and the photovoltaic module of the invention, are described below and claims with further details, preferred embodiments, ranges and properties, which preferred embodiments, ranges and properties can be in any combination and combined in any order.

Polypropylene Composition of the Invention and Components Thereof

The components and amounts of the polymer composition can be chosen to optimize the property balance desired for an end application, as evident for a skilled person.

Accordingly, in a preferable embodiment of the invention, the polypropylene composition comprises, preferably consists of,
(i) more than 30, preferably 40 to 98.5, preferably 50 to 98.5, preferably 60 to 98, preferably 70 to 98, wt % of a polymer of propylene (PP),
(ii) 1 to 20, preferably 2 to 18, more preferably 3 to 15, wt % of a flame retardant product comprising an inorganic derivative of Phosphor,
(iii) 1 to 30, preferably 2 to 20, preferably 3 to 15, wt % of a filler,
(iv) 0.2 to 5, preferably 0.3 to 4.5, more preferably 0.4 to 4, wt % of an additive(s) other than the flame retardant product (ii), and
(v) 0 to 30, preferably 0 to 20, preferably 0 to 18, more preferably 0 to 15, wt % of a plastomer, and
(vi) 0 to 30, preferably 0 to 20, preferably 0 to 15, wt % further polymer(s) other than (i) or (v);
based on the total amount (100 wt %) of the polymer composition of the invention, as defined above or below or in claims.

"Based on the total amount (100 wt %) of the polymer composition of the invention" means that the amounts of the components present in the polymer composition total to 100 wt %.

The (i) polymer of propylene (PP) can also be a mixture of two or more PP polymer (i) components.

The PP polymer can be a homopolymer or copolymer of propylene. Moreover, the PP polymer can comprise one or more PP polymer components which are different.

Preferably the PP polymer is a copolymer of propylene. More preferably the PP polymer (i) is a heterophasic copolymer of propylene (iPP) which comprises, preferably consists of, a polypropylene matrix component and
an elastomeric propylene copolymer component which is dispersed in said polypropylene matrix; or a mixture of two or more, e.g. two such heterophasic copolymers of propylene (iPP) which are different.

"Heterophasic copolymer of propylene (iPP)" is referred herein also as "PP copolymer".

In this embodiment the combination of heterophasic copolymer of propylene (iPP) with the FR and filler (iii) of the invention contributes to a property balance of the invention by further contributing to highly feasible mechanical properties, like high stiffness, which property balance is very desirable in many polypropylene related end applications as stated above or below. Further preferably, in this embodiment, said polymer composition of the invention contributes to one or more, or preferably all, of the following desirable properties: advantageous water intake property, high thermal and mechanical stability (expressed e.g. HDT) both during lamination, if needed when producing the article, and at end use application, and/or, also preferably, a very advantageous shrinkage behavior and dimensional stability as indicated by CLTE measurements.

If desired, the property balance of the polymer composition of the invention can even be further modified with softer materials, like plastomers, or even with other component(s) including other polymers, like PP polymer, other than the PP polymer as defined above, below or in claims.

In one preferable embodiment the polymer of propylene (PP) is a heterophasic copolymer of propylene (iPP) which comprises a heterophasic copolymer of propylene (A) which comprises, preferably consists of, a polypropylene matrix component (a1) and an elastomeric propylene copolymer component (a2) which is dispersed in said polypropylene matrix (a1);

and wherein the heterophasic copolymer of propylene (A) has a Melting temperature (Tm) (DSC) of at least 145° C., when measured as described in the specification under Determination methods, and a Vicat softening temperature (Vicat A) of at least 90° C. (according to ASTM D 1525, method A, 50° C./h, 10 N).

In one embodiment the heterophasic copolymer of propylene (iPP) consists of the heterophasic copolymer of propylene (A).

In another embodiment the heterophasic copolymer of propylene (iPP) comprises the heterophasic copolymer of propylene (A) and one or more, e.g. one, further heterophasic copolymer of propylene (iPP) which is different from PP copolymer (A).

The heterophasic copolymer of propylene (iPP) and the heterophasic copolymer of propylene (A) is referred herein also as "PP copolymer" and, respectively, "PP copolymer (A)".

The "polypropylene matrix component (a1)" is referred herein also as "matrix component (a1)". The "elastomeric propylene copolymer component (a2)" is referred herein also as "elastomeric component (a2)".

Generally, a "heterophasic copolymer of propylene" (as used herein in connection to PP copolymer or preferable PP copolymer (A)) is a propylene copolymer comprising a propylene homo polymer or propylene random copolymer matrix component (1) and an elastomeric copolymer component (2) of propylene with one or more of ethylene and/or C4-C8 alpha olefin comonomers, wherein the elastomeric (amorphous) copolymer component (2) is (finely) dispersed in said propylene homo or random copolymer matrix polymer (1).

As well known "comonomer" refers to copolymerisable comonomer units.

The XCS fraction of PP copolymer (or preferable PP copolymer (A)) is regarded herein as the elastomeric component (or preferable elastomeric component (a2)), since the amount of XCS fraction in the matrix component is conventionally markedly lower. For instance, in case the matrix component (or preferable matrix component (a1)) is a homopolymer of propylene, then the amount of the xylene cold soluble (XCS) fraction (amorphous fraction) (wt %) of the heterophasic copolymer of propylene is understood in this application also as the amount of the elastomeric propylene copolymer component present in the PP copolymer (or preferable PP copolymer (A)).

The copolymer of propylene, preferably the PP copolymer, is preferably a propylene copolymer comprising a propylene homo polymer or propylene random copolymer with one or more of ethylene and/or C4-C8 alpha olefin comonomers as the matrix component and an elastomeric copolymer component of propylene with one or more of ethylene and/or C4-C8 alpha olefin comonomers, wherein the elastomeric (amorphous) copolymer component is dispersed in said propylene homo or random copolymer matrix polymer.

The total comonomer content of the copolymer of propylene, preferably of the PP copolymer, is preferably of 0.5 to 20, preferably of 1.0 to 20, wt %, when measured as described in the specification under Determination methods, preferably the comonomer(s) is selected from ethylene and/or C4-C8 alpha olefin comonomers, more preferably from ethylene.

Preferably the polypropylene matrix component of the PP copolymer is a homopolymer of propylene.

The melting temperature, Tm, of PP copolymer (A) is preferably of 158 to 170, preferably of 160 to 170, ° C., when measured as described in the specification under Determination methods.

The Vicat softening temperature (Vicat A) of PP copolymer (A) is preferably of at least 100° C., preferably of 130 to 200° C., more preferably 130 to 160° C.

Preferably, the polypropylene matrix (a1) of the PP copolymer (A) is a homopolymer of propylene.

Even more preferably the heterophasic copolymer of propylene (A) has one or more, in any order, preferably all, of the following further properties:

$MFR_2$ of 0.2 to 20, preferably 0.2 to 15.0, preferably of 0.5 to 10, g/10 min when measured according to ISO 1133 (at 230° C. and 2.16 kg load), Xylene cold soluble (XCS) fraction in amount of 3 to 30, preferably of 5 to 25, wt %, when measured as described in specification under Determination methods, Comonomer content of 0.5 to 20, preferably of 1.0 to 20, wt %, when measured as described in the specification under Determination methods, preferably the comonomer(s) is selected from ethylene and/or C4-C8 alpha olefin comonomers, more preferably from ethylene, Flexural modulus of at least 900, preferably of 950 to 3000, preferably of 1000 to 2400, MPa, when measured according to ISO178 as described in the specification under Determination methods, and/or Density of 900 to 910 $kg/m^3$, when measured as described in the specification under Determination methods.

The polypropylene composition according to any of the preceding claims, wherein the inorganic derivative of Phosphor of the flame retardant product (ii) is preferably an inorganic Phosphinic acid derivative, preferably an inorganic salt of Phosphinic acid, preferably a metal salt of Phosphinic acid, preferably an aluminium salt of Phosphinic acid (also known as Aluminum hypophosphite).

According to one preferable embodiment the inorganic derivative of Phosphor is an aluminium salt of Phosphinic acid having a CAS number of 7784-22-7.

Suitable inorganic phosphorous based FRs are preferably commercially available. An highly suitable example of commercial FR, is the flame retardant product sold under the trade name Phoslite B404A(F), produced and supplied by ITALMATCH CHEMICALS S.p.A.

Accordingly the amount of flame retardant product (ii) (=FR) means herein the amount (wt %, based on the PP composition) of the flame retardant product (ii) as supplied by producer thereof. Accordingly FR may contain further components in minor amounts, like additives, flame retardant synergists and/or carrier medium. Thus it is to be understood that such further components are calculated to the amount of the FR.

Thus the flame retardant product (ii) may optionally further comprise so called synergist compound which further enhances the flame retardant properties. Examples of such flame retardant synergists are based on organic phosphorus chemistry like organic phosphinates.

More preferably the FR of the invention comprises at least 60, preferably at least 70 to 99, more preferably at least 75 to 99, preferably 80 to 99, more preferably at least 85 to 99, wt % of the inorganic derivative of Phosphor.

It is preferred that FR of the present invention is without ammonium polyphosphate and further flame retardant synergist, preferably FR of the present invention is without ammonium polyphosphate. I.e. FR does not comprise any ammonium polyphosphate and further flame retardant synergist, preferably FR of the present invention does not comprise ammonium polyphosphate.

The filler (iii) is preferably an inorganic filler. The particle size and/or aspect ratio of the filler (iii) can vary as well-known by a skilled person. The filler (iii) can be e.g. conventional and commercially available. Preferably, the filler (iii) is selected from one or more of wollastonite, talc or glass fiber. Such filler products are commercial products with varying particle size and/or aspect ratio and can be chosen by a skilled person depending on the desired end article and end application.

Wollastonite has a well-known meaning and is silicate of calcium ($CaSiO_3$) based mineral: Preferably wollastonite has an aspect ratio of 13:1 to 4:1. Preferably wollastonite has a median particle size D50 of 15 to 5 μm. Such wollastonite products are commercially available and supplied e.g. by Vanderbilt Chemicals, Nordkalk, Fibertec Inc.

Talc has a well-known meaning. Preferably talc has a median particle size D50 of 0.8 to 5 μm. Further preferably, the particle size D98 of talc is smaller than 40 μm. Particle size D98 means maximum 2% of filler has size greater than this value. Such talc products are commercially available and supplied e.g. by IMI Fabi S.p.A., Imerys talc, Mondo minerals Glass fibre has a well-known meaning. Glass fibres are preferably chopped to a diameter of 10 to 13 μm. Further preferably, glass fibres have a fibre length of 4 to 4.5 mm. The glass fibre is selected with suitable sizing for polypropylene materials, and within the skills of a skilled person. Suppliers of the glass fibres are e.g. Taiwan Glass, Nippon electric Glass, Johns Manville, Owens Corning.

The above preferable properties for preferable fillers of the invention further contribute to a very good dispersion of filler to the polymer composition. The good dispersion contributes e.g. to good mechanical performance and to good visual appearance if desired to the end application. E.g. in PV module applications the good mechanical performance and preferably also good visual appearance are very advantageous.

Preferably, the filler (iii) is selected from wollastonite or talc. Wollastonite and talc can provide very advantageous dispersion to the polymer composition.

Preferably the filler (iii) is other than so called pigment, which has a well-known meaning in the art, preferably is other than titanium dioxide ($TiO_2$) pigment.

In one embodiment of the polymer composition of the invention, no plastomer (v) is present in the polymer composition. I.e the amount of the plastomer is 0 wt %.

In another embodiment of the invention the plastomer (v) is present.

Preferably the polymer composition comprises a plastomer (v).

Thus preferably, the polypropylene composition of the invention comprises,
(i) more than 30, preferably 40 to 98.5, preferably 50 to 98.5, preferably 60 to 98, preferably 70 to 98, wt % of a polymer of propylene (PP),
(ii) 1 to 20, preferably 2 to 18, more preferably 3 to 15, wt % of a flame retardant product comprising an inorganic derivative of Phosphor,
(iii) 1 to 30, preferably 2 to 20, preferably 3 to 15, wt % of a filler,
(iv) 0.2 to 5, preferably 0.3 to 4.5, more preferably 0.4 to 4, wt % of an additive(s) other than the flame retardant product (ii),
(v) 3 to 30, preferably 3 to 20, preferably 3 to 18, more preferably 4 to 15, more preferably 4 to 12, wt % of a plastomer, and
(vi) 0 to 30, preferably 0 to 20, preferably 0 to 15, wt % further polymer(s) other than (i) or (v);
based on the total amount (100 wt %) of the polymer composition of the invention, as defined above or below or in claims.

The optional and preferable plastomer (v) is preferably a copolymer of ethylene with at least one C3 to C10 alpha-olefin. The plastomer (v) has preferably one or all, preferably all, of the below properties
a density of 860 to 915, preferably 860 to 910, $kg/m^3$,
$MFR_2$ of 0.1 to 50, preferably 0.2 to 40, (190° C., 2.16 kg), and/or
the alpha-olefin comonomer is octene.

The optional plastomer (v) is preferably produced using a metallocene catalyst, which term has a well-known meaning in the prior art. The suitable plastomers (v) are commercially available, e.g. plastomer products under tradename QUEO™, supplied by Borealis, or Engage™, supplied by ExxonMobil, Lucene supplied by LG, or Tafmer supplied by Mitsui. If present, then the amount of the optional plastomer (v) is lower than the amount of polymer PP (i).

The optional further polymer(s) (vi) can be e.g. a functionalised polymer (e.g. polymer which is functionalised by grafting). For instance, polar functional groups, such as maleic anhydride (MAH), can be grafted to a polyolefin to form functional polymers thereof. If present, then the amount of the optional further polymer(s) (vi) (different from (i) and (v)) is less than the amount of PP polymer (i). Herein, the PP polymer of the invention as defined above, below or in claims, is without grafted functional units. I.e. the term PP polymer (i) of the invention excludes the PP polymer grafted with functional groups.

If both of the optional plastomer (v) and further polymer(s) (vi) are present, then the amount of PP polymer (i) is higher than the combined amount of the plastomer (v) and further polymer(s) (vi).

In one embodiment of the composition, and preferably, the further polymer(s) (vi), if present, is other than polyamide polymer. I.e. no polyamide polymer is present in the polymer composition.

In one embodiment of the composition, no further polymer(s) (vi) is present in the polymer composition. I.e. the amount of further polymer(s) (vi) in the polymer composition is 0 wt %.

In one embodiment of the composition, a further polymer(s) (vi) is present in the polymer composition. In such case the polymer composition (100 wt %) preferably comprises 3 to 30, preferably 3 to 20, preferably 3 to 18, more preferably 4 to 15, wt % of a further polymer(s) (vi).

The composition of the invention comprises also additives (iv) other than the flame retardant product (ii) and filler (iii). Such additives (iv) are preferably suitable e.g. for film or photovoltaic module applications, including without limiting to, antioxidants, UV light stabilisers, nucleating agents, clarifiers, brighteners, acid scavengers, as well as slip agents, etc. Such additives are generally commercially available and are described, for example, in "Plastic Additives Handbook", 5th edition, 2001 of Hans Zweifel.

Each additive (iv) can be used e.g. in conventional amounts.

Any optional carrier polymers of flame retardant product (ii), filler (iii) and/or additive(s) (iv), e.g. master batches of components (ii), (iii) or, respectively, (iv) together with the carrier polymer, are calculated to the amount of the respective component (ii), (iii) or (iv), based on the amount (100%) of the composition of the invention.

The polypropylene composition of the invention preferably has an $MFR_2$ of 1.0 to 25.0, preferably of 2.0 to 20, preferably of 3 to 15, g/10 min, when measured according to ISO 1133 (at 230° C. with 2.16 kg load) as defined below under the Determination methods. The polypropylene composition has more preferably $MFR_2$ of 3 to 10 g/10 min.

The polypropylene composition of the invention preferably has a Xylene cold soluble (XCS) content in amount of 5 to 40, preferably 5 to 35%, when measured as defined below under the Determination methods. The XCS of the polypropylene composition is more preferably of 10 to 40, preferably 15 to 30%.

The polypropylene composition of the invention preferably has a Vicat softening temperature (Vicat A) of 100 to 200, more preferably of 110 to 175,° C., when measured as described below under Determination methods. The Vicat A of the polypropylene composition is more preferably of 120 to 160° C.

The polypropylene composition of the invention preferably has a Tensile modulus of at least 800, preferably of 800 to 3000, preferably of 900 to 2500, MPa, when measured in machine direction (MD) from 200 μm monolayer cast film sample as defined below under the Determination methods. Said Tensile modulus of the polypropylene composition is preferably of 900 to 2300 MPa.

The polymer composition of the invention preferably has a Tensile strength of 20 to 40, preferably of 23 to 37, preferably of 26 to 33, MPa, when measured in machine direction (MD) from 200 μm monolayer cast film sample as defined below under the Determination methods.

The polymer composition of the invention preferably has a Flexural modulus of 1100 to 3000, preferably of 1300 to 2800, preferably of 1500 to 2500, MPa, when measured from an injection moulded sample as defined below under the Determination methods.

The polymer composition of the invention preferably has a Coefficient linear thermal expansion (CLTE) of 100 μm/m/° C. or less, preferably of 40 to 95, preferably of 45 to 90, preferably of 50 to 80, μm/m/° C. when measured in machine direction (MD) from an injection moulded sample at temperature range from −30° C. to +80° C. and at heating rate of 1° C./min as defined below under the Determination methods.

The polymer composition of the invention preferably has a Heat Deflection Temperature (HDT) of 75° C. or more, preferably of 75 to 150, preferably of 80 to 140, preferably of 85 to 135,° C., when measured as defined below under the Determination methods.

PP polymer can be commercially available grade or can be produced e.g. by conventional polymerisation processes and process conditions using e.g. the conventional catalyst system known in the literature.

One feasible polymerisation process including the conditions and catalyst system is generally described below for the PP copolymer, i.e. for the heterophasic copolymer of propylene (iPP), and naturally applies also for the preferable heterophasic copolymer of propylene (A) of the polypropylene composition. It is evident that the below description can be applied to a homopolymer or a random copolymer of polypropylene, as well, whereby said polymers can be polymerised e.g. in optional prepolymerisation reactor following first reactor (preferably loop reactor) and then second reactor (preferably first gas phase reactor) using preferably the conditions as described below.

The polypropylene matrix component of the PP copolymer may be a unimodal or a multimodal random copolymer or homopolymer of propylene which both have a well-known meaning. Multimodal random copolymer or homopolymer of propylene means herein that it has at least two polymer fractions which are different e.g. with one or two of the following properties: 1) weight average molecular weight or 2) MFR. In case of random copolymer of propylene as the matrix component, the copolymer can also be multimodal with respect to 3) comonomer content, optionally in combination with any or both of the above differences 1) and 2).

The matrix component of the PP copolymer can be a homopolymer or random copolymer of propylene. It is preferred that the matrix component of the PP copolymer is a homopolymer of propylene.

Accordingly, it is preferred that all the comonomers as defined above, which are present in the PP copolymer, originate from the elastomeric propylene copolymer component.

It is preferred that the PP copolymer consists of the matrix component and the elastomeric component. The PP copolymer may optionally comprise a prepolymer fraction, as well known in the polymer field. In such case the amount of the prepolymer is calculated to the amount of the matrix component.

As said, the iPP copolymer can be commercially available grade or can be produced e.g. by conventional polymerisation processes.

As to polymerisation of the heterophasic copolymer of propylene, the individual components (matrix and elastomeric components) of PP copolymer can be produced separately and blended mechanically by mixing in a mixer or extruder. However it is preferred that the PP copolymer comprising the matrix component and the elastomeric component are produced in a sequential process, using reactors in serial configuration and operating at different reaction conditions. As a consequence, each fraction prepared in a specific reactor can have its own molecular weight distribution, MFR and/or comonomer content distribution.

The PP copolymer according to this invention is preferably produced in a sequential polymerisation process, i.e. in a multistage process, known in the art, wherein the matrix component is produced at least in one slurry reactor, preferably at least in a slurry reactor, and optionally, and preferably in a subsequent gas phase reactor, and subsequently the elastomeric component is produced at least in one, i.e. one or two, gas phase reactor(s) (gpr), preferably in one gpr.

Accordingly it is preferred that the PP copolymer is produced in a sequential polymerisation process comprising the steps of (a) polymerising propylene and optionally at least one ethylene and/or C4 to C12 α-olefin, preferably propylene as the only monomer, in the presence of a catalyst in a first reactor (R1), (b) transferring the reaction mixture of the polymerised first polypropylene, preferably propylene homopolymer, fraction together with the catalyst, into a second reactor (R2), (c) polymerising in the second reactor (R2) and in the presence of said first polypropylene polymer, propylene and optionally at least one ethylene and/or C4 to C12 α-olefin, preferably propylene as the only monomer, in obtaining thereby the second polypropylene fraction, preferably said second polypropylene fraction is a second propylene homopolymer, whereby said first polypropylene fraction and said second polypropylene fraction form the matrix component of the PP copolymer, (d) transferring the reaction mixture of the polymerised matrix component of step (c) into a third reactor (R3), (e) polymerising in the third reactor (R3) and in the presence of the matrix component obtained in step (c), propylene and at least one ethylene and/or C4 to C12 α-olefin obtaining thereby the elastomeric component of PP copolymer, wherein the elastomeric propylene copolymer component is dispersed in said matrix component.

Optionally the elastomeric component of the PP copolymer can be produced in two reactors, whereby after above step (e), (f) transferring the PP product of step (e) in which the first elastomeric propylene copolymer fraction is dispersed in a fourth reactor (R4), and (g) polymerising in the fourth reactor (R4) and in the presence of the mixture obtained in step (e) propylene and at least one ethylene and/or C4 to C12 α-olefin obtaining thereby the second elastomeric propylene copolymer fraction, whereby the matrix component of step (c) dispersed in the first elastomeric propylene copolymer fraction and in the second elastomeric propylene copolymer fraction form the PP copolymer.

Preferably between the second reactor (R2) and the third reactor (R3) the monomers are flashed out.

The term "sequential polymerisation process" indicates that the PP copolymer is produced in at least two, like three, reactors connected in series. Accordingly the present process comprises at least a first reactor (R1) and a second reactor (R2), more preferably a first reactor (R1), a second reactor (R2), a third reactor (R3) and optionally a fourth reactor (R4). The term "polymerisation reactor" shall indicate one of the main polymerisation steps. Thus in case the process consists of four polymerisation reactors, this definition does not exclude the option that the overall process comprises for instance a prepolymerisation step in a prepolymerisation reactor. The term "consist of" is only a closing formulation in view of the main polymerisation reactors.

Any prepolymer fraction is counted into the amount of the first polypropylene fraction.

The first reactor (R1) is preferably a slurry reactor (SR) and can be any continuous or simple stirred batch tank reactor or loop reactor operating in bulk or slurry. Bulk means a polymerisation in a reaction medium that comprises of at least 60% (w/w) monomer. According to the present invention the slurry reactor (SR) is preferably a (bulk) loop reactor (LR).

The second reactor (R2), the third reactor (R3) and the optional fourth reactor (R4) are preferably gas phase reactors (GPR). Such gas phase reactors (GPR) can be any mechanically mixed or fluid bed reactors. Preferably the gas phase reactors (GPR) comprise a mechanically agitated fluid bed reactor with gas velocities of at least 0.2 m/sec.

Thus it is appreciated that the gas phase reactor is a fluidized bed type reactor preferably with a mechanical stirrer.

Thus in a preferred embodiment the first reactor (R1) is a slurry reactor (SR), like a loop reactor (LR), whereas the second reactor (R2), the third reactor (R3) and the optional fourth reactor (R4) are gas phase reactors (GPR). Accordingly for the instant process at least three, namely a slurry reactor (SR), like a loop reactor (LR), a first gas phase reactor (GPR-1), a second gas phase reactor (GPR-2) and an optional a third gas phase reactor (GPR-3) connected in series are used. In case of a prepolymerisation step a prepolymerisation reactor is placed prior to the slurry reactor (SR).

A preferred multistage process is a "loop-gas phase"-process, such as developed by Borealis A/S, Denmark (known as BORSTAR® technology) described e.g. in patent literature, such as in EP 0 887 379, WO 92/12182 WO 2004/000899, WO 2004/111095, WO 99/24478, WO 99/24479 or in WO 00/68315.

A further suitable slurry-gas phase process is the Spheripol® process of LyondellBasell.

Preferably, in the instant process for producing the PP copolymer as defined above the conditions for the first reactor (R1), i.e. the slurry reactor (SR), like a loop reactor (LR), of step (a) may be as follows:

the temperature is within the range of 50° C. to 110° C., preferably between 60° C. and 100° C., more preferably between 68 and 95° C., the pressure is within the range of 20 bar to 80 bar, preferably between 40 bar to 70 bar, hydrogen can be added for controlling the molar mass in a manner known per se.

Subsequently, the reaction mixture from step (a) is transferred to the second reactor (R2), i.e. gas phase reactor (GPR-1), i.e. to step (c), whereby the conditions in step (c) are preferably as follows:

the temperature is within the range of 50° C. to 130° C., preferably between 60° C. and 100° C., the pressure is within the range of 5 bar to 50 bar, preferably between 15 bar to 35 bar, hydrogen can be added for controlling the molar mass in a manner known per se.

The condition in the second gas phase reactor (GPR-2) and in the optional third gas phase reactor (GPR-3) are similar to the second reactor (R2) (=first gas phase reactor (GPR-1).

The residence time can vary in the three reactor zones.

In one embodiment of the process for producing the matrix component of the PP copolymer, the residence time in bulk reactor, e.g. loop, is in the range 0.1 to 2.5 hours, e.g. 0.15 to 1.5 hours and the residence time in gas phase reactor will generally be 0.2 to 6.0 hours, like 0.5 to 4.0 hours.

If desired, the polymerisation may be effected in a known manner under supercritical conditions in the first reactor (R1), i.e. in the slurry reactor (SR), like in the loop reactor (LR), and/or as a condensed mode in the gas phase reactors (GPR).

Preferably the process comprises also a prepolymerisation with the catalyst system, as described in detail below, comprising a Ziegler-Natta procatalyst, an external donor and optionally a cocatalyst.

In a preferred embodiment, the prepolymerisation is conducted as bulk slurry polymerisation in liquid propylene, i.e. the liquid phase mainly comprises propylene, with minor amount of other reactants and optionally inert components dissolved therein.

The prepolymerisation reaction is typically conducted at a temperature of 10 to 60° C., preferably from 15 to 50° C., and more preferably from 20 to 45° C.

The pressure in the prepolymerisation reactor is not critical but must be sufficiently high to maintain the reaction mixture in liquid phase. Thus, the pressure may be from 20 to 100 bar, for example 30 to 70 bar.

The catalyst components are preferably all introduced to the prepolymerisation step. However, where the solid catalyst component (i) and the cocatalyst (ii) can be fed separately it is possible that only a part of the cocatalyst is introduced into the prepolymerisation stage and the remaining part into subsequent polymerisation stages.

Also in such cases it is necessary to introduce so much cocatalyst into the prepolymerisation stage that a sufficient polymerisation reaction is obtained therein.

It is possible to add other components also to the prepolymerisation stage. Thus, hydrogen may be added into the prepolymerisation stage to control the molecular weight of the prepolymer as is known in the art. Further, antistatic additive may be used to prevent the particles from adhering to each other or to the walls of the reactor.

The precise control of the prepolymerisation conditions and reaction parameters is within the skills of the skilled person.

After the PP copolymer has been removed from the last polymerisation stage, it is preferably subjected to process steps for removing the residual hydrocarbons from the polymer. Such processes are well known in the art and can include pressure reduction steps, purging steps, stripping steps, extraction steps and so on. Also combinations of different steps are possible. After the removal of residual hydrocarbons the PP copolymer is preferably mixed with additives as it is well known in the art. Such additives are described below under the polymer composition of the invention. The polymer particles are then extruded to pellets as it is known in the art. Preferably co-rotating twin screw extruder is used for the extrusion step. Such extruders are manufactured, for instance, by Coperion (Werner & Pfleiderer) and Japan Steel Works.

The PP copolymer of the invention is preferably produced by polymerisation using any suitable Ziegler-Natta type. Typical suitable Ziegler-Natta type catalyst is stereospecific, solid high yield Ziegler-Natta catalyst component comprising as essential components Mg, Ti and Cl. In addition to the solid catalyst a cocatalyst(s) as well external donor(s) are typically used in polymerisation process.

Components of catalyst may be supported on a particulate support, such as inorganic oxide, like silica or alumina, or, usually, the magnesium halide may form the solid support. It is also possible that catalysts components are not supported on an external support, but catalyst is prepared by emulsion-solidification method or by precipitation method. Alternatively the PP copolymer of the invention can be produced using a modified catalyst system as described below.

More preferably, a vinyl compound of the formula (I) is used for the modification of the catalyst:

CH2=CH—CHR1R2　　(I)

wherein R1 and R2 together form a 5- or 6-membered saturated, unsaturated or aromatic ring, optionally containing substituents, or independently represent an alkyl group comprising 1 to 4 carbon atoms, whereby in case R1 and R2 form an aromatic ring, the hydrogen atom of the —CHR1R2 moiety is not present.

More preferably, the vinyl compound (I) is selected from: vinyl cycloalkane, preferably vinyl cyclohexane (VCH), vinyl cyclopentane, 3-methyl-1-butene polymer and vinyl-2-methyl cyclohexane polymer. Most preferably the vinyl compound (I) is vinyl cyclohexane (VCH) polymer.

The solid catalyst usually also comprises an electron donor (internal electron donor) and optionally aluminium. Suitable internal electron donors are, among others, esters of carboxylic acids or dicarboxylic acids, like phthalates, maleates, benzoates, citraconates, and succinates, 1,3-diethers or oxygen or nitrogen containing silicon compounds. In addition mixtures of donors can be used.

The cocatalyst typically comprises an aluminium alkyl compound. The aluminium alkyl compound is preferably trialkyl aluminium such as trimethylaluminium, triethylaluminium, tri-isobutylaluminium or tri-n-octylaluminium. However, it may also be an alkylaluminium halide, such as diethylaluminium chloride, dimethylaluminium chloride and ethylaluminium sesquichloride.

Suitable external electron donors used in polymerisation are well known in the art and include ethers, ketones, amines, alcohols, phenols, phosphines and silanes. Silane type external donors are typically organosilane compounds containing Si—OCOR, Si—OR, or Si—NR2 bonds, having silicon as the central atom, and R is an alkyl, alkenyl, aryl, arylalkyl or cycloalkyl with 1-20 carbon atoms are known in the art.

Examples of suitable catalysts and compounds in catalysts are shown in among others, in WO 87/07620, WO 92/21705, WO 93/11165, WO 93/11166, WO 93/19100, WO 97/36939, WO 98/12234, WO 99/33842, WO 03/000756, WO 03/000757, WO 03/000754, WO 03/000755, WO 2004/029112, EP 2610271, WO 2012/007430. WO 92/19659, WO 92/19653, WO 92/19658, U.S. Pat. Nos. 4,382,019, 4,435, 550, 4,465,782, 4,473,660, 4,560,671, 5,539,067, 5,618,771, EP45975, EP45976, EP45977, WO 95/32994, U.S. Pat. Nos. 4,107,414, 4,186,107, 4,226,963, 4,347,160, 4,472,524, 4,522,930, 4,530,912, 4,532,313, 4,657,882, 4,581,342, 4,657,882.

The obtained PP copolymer is then compounded together with the flame retardant product (ii), filler (iii), additives(s) (iv), optional plastomer (v), and with optional further polymer(s) (vi) in a known manner. The compounding can be effected in a conventional extruder e.g. as described above and the obtained melt mix is produced to an article or, preferably, pelletised before used for the end application. Part or all of the additives or optional components may be added during the compounding step.

End Applications of the Polymer Composition

The invention is further directed to a use of the polymer composition as defined above or below for producing an article comprising a polymer composition, which comprises
(i) more than 30, preferably 40 to 98.5 wt % of a polymer of propylene (PP),
(ii) 1 to 20 wt % of a flame retardant product comprising an inorganic derivative of Phosphor,
(iii) 1 to 30 wt % of a filler,
(iv) 0.2 to 5 wt % of an additive(s) other than the flame retardant product (ii), and
(v) 0 to 30 wt % of a plastomer;
based on the total amount (100 wt %) of the polypropylene composition, as defined above or below or in claims.

The invention is further directed to an article comprising a polymer composition, which comprises, preferably consists of,
(i) more than 30, preferably 40 to 98.5 wt % of a polymer of propylene (PP),
(ii) 1 to 20 wt % of a flame retardant product comprising an inorganic derivative of Phosphor,
(iii) 1 to 30 wt % of a filler,
(iv) 0.2 to 5 wt % of an additive(s) other than the flame retardant product (ii),
(v) 0 to 30 wt % of a plastomer, and
(vi) 0 to 30 wt % further polymer(s) other than (i) or (v);
preferably which comprises, preferably consists of,
(i) more than 30, preferably 40 to 98.5, preferably 50 to 98.5, preferably 60 to 98, preferably 70 to 98, wt % of a polymer of propylene (PP), (ii) 1 to 20, preferably 2 to 18, more preferably 3 to 15, wt % of a flame retardant product comprising an inorganic derivative of Phosphor, (iii) 1 to 30, preferably 2 to 20, preferably 3 to 15, wt % of a filler, (iv) 0.2 to 5, preferably 0.3 to 4.5, more preferably 0.4 to 4, wt % of an additive(s) other than the flame retardant product (ii), (v) 0 to 30, preferably 0 to 20, preferably 0 to 18, more preferably 0 to 15, wt % of a plastomer, and (vi) 0 to 30, preferably 0 to 20, preferably 0 to 15, wt % further polymer(s) other than (i) or (v);

based on the total amount (100 wt %) of the polymer composition, as defined above or below or in claims.

The article preferably comprises a layer element which comprises at least one layer comprising the polymer composition of the invention, as defined above or below or in claims.

The layer element can be a monolayer or multilayer element which comprises at least one layer comprising the polymer composition of the invention. A monolayer element can be produced by extrusion, e.g. cast film or blown film extrusion. Layers of a multilayer element can be produced by extrusion, e.g. by coextrusion, by lamination or by a combination of extrusion and lamination. Extrusion and lamination processes are well-known in the art.

Furthermore, the article can comprise one layer element or two or more layer elements. In case of two or more layer elements, at least one of the layer elements comprises at least one layer comprising the polymer composition of the invention, as defined above or below or in claims.

In one embodiment the article is a layer element comprising at least one layer which comprises the polymer composition of the invention, as defined above or below or in claims.

Preferably, said at least one layer of the layer element of the article of the invention comprises at least 70 wt %, preferably at least 80 wt %, preferably at least 90 wt %, preferably 90 to 100 wt %, preferably consists of, the polymer composition of the invention.

Preferably, the monolayer element of the article of the invention comprises at least 70 wt %, preferably at least 80 wt %, preferably at least 90 wt %, preferably 90 to 100 wt %, preferably consists of, the polymer composition of the invention.

Also preferably, the multilayer element of the article of the invention comprises at least 35, preferably at least 50 wt %, preferably at least 60 wt %, preferably at least 60 to 90 wt %, preferably at least 60 to 95 wt %, preferably at least 70 to 95 wt %, of the polymer composition of the invention.

In this embodiment the layer element of the article is preferably a film for various end applications e.g. for packaging applications without limiting thereto. In this invention the term "film" covers also thicker sheet structures e.g. for thermoforming.

In this embodiment the layer element of an article of the invention is preferably a film which is selected from a monolayer film comprising the polymer composition of the invention, or a multilayer film wherein at least one layer comprises the polymer composition of the invention; as defined above or below or in claims.

In a preferable embodiment the article which comprises one or more layer elements, preferably the article is a photovoltaic module comprising one or more layer elements, wherein at least one layer element is selected from a monolayer element comprising the polymer composition of the invention, or a multilayer element wherein at least one layer comprises the polymer composition of the invention; as defined above or below or in claims.

The thickness of the layer element and in case of multilayer element, the thickness of the individual layers of the element, can vary depending on the end application, as evident for a skilled person. As an example only, the thickness of the layer element of the invention can be e.g. 0.02 to 5 mm, preferably 0.05 to 3 mm. Moreover, as an example only, the thickness of the at least one layer of the layer element can be 5.0 to 400 µm.

In a preferred embodiment the article is a photovoltaic module which comprises a layer element of the invention wherein the layer element is selected from a monolayer element comprising the polymer composition of the invention, or a multilayer element wherein at least one layer comprises the polymer composition of the invention; as defined above or below or in claims.

Photovoltaic Module

The layer element, i.e. the mono- or multilayer element, of the invention is preferably a monolayer element or a multilayer element of a photovoltaic module as the article of the invention.

The invention thus provides a photovoltaic module comprising at least one photovoltaic layer element and at least one layer element which is the layer element of the invention comprising at least one layer which comprises a polymer composition comprising (i) more than 30, preferably 40 to 98.5 wt % of a polymer of propylene (PP), (ii) 1 to 20 wt % of a flame retardant product comprising an inorganic derivative of Phosphor, (iii) 1 to 30 wt % of a filler, (iv) 0.2 to 5 wt % of an additive(s) other than the flame retardant product (ii), (v) 0 to 30 wt % of a plastomer, and (vi) 0 to 30 wt % further polymer(s) other than (i) or (v);

preferably which comprises, preferably consists of, (i) more than 30, preferably 40 to 98.5, preferably 50 to 98.5, preferably 60 to 98, preferably 70 to 98, wt % of a polymer of propylene (PP), (ii) 1 to 20, preferably 2 to 18, more preferably 3 to 15, wt % of a flame retardant comprising an inorganic derivative of Phosphor, (iii) 1 to 30, preferably 2 to 20, preferably 3 to 15, wt % of a filler, (iv) 0.2 to 5, preferably 0.3 to 4.5, more preferably 0.4 to 4, wt % of an additive(s) other than the flame retardant product (ii), (v) 0 to 30, preferably 0 to 20, preferably 0 to 18, more preferably 0 to 15, wt % of a plastomer, and (vi) 0 to 30, preferably 0 to 20, preferably 0 to 15, wt % further polymer(s) other than (i) or (v);

based on the total amount (100 wt %) of the polymer composition, as defined above or below or in claims.

In case the layer element of the photovoltaic module of the invention is a multilayer element, then in one embodiment the at least one layer of the multilayer element is a laminated layer of the multilayer element.

Alternatively, in case the layer element of the photovoltaic module of the invention is a multilayer element, then in another embodiment the at least one layer of the multilayer element is an extruded or coextruded layer of a multilayer element.

More preferably, the photovoltaic module of the invention comprises, in the given order, a protective top layer element, a front encapsulation layer element, at least one photovoltaic layer element, a rear encapsulation layer element, a backsheet layer element and optionally a protective cover, wherein at least one of said layer elements, preferably the backsheet layer element, comprises at least one layer comprising said polymer composition of the invention, as defined above or below or in claims.

It is preferred that said at least one layer element of the photovoltaic module of the invention, as defined above or below or in claims, is a backsheet layer element.

Accordingly, the invention further provides a backsheet layer element for a photovoltaic module comprising at least one layer which comprises said polymer composition of the invention comprising
((i) more than 30, preferably 40 to 98.5 wt % of a polymer of propylene (PP),
(ii) 1 to 20 wt % of a flame retardant product comprising an inorganic derivative of Phosphor,
(iii) 1 to 30 wt % of a filler,
(iv) 0.2 to 5 wt % of an additive(s) other than the flame retardant product (ii),
(v) 0 to 30 wt % of a plastomer, and
(vi) 0 to 30 wt % further polymer(s) other than (i) or (v);
preferably which comprises, preferably consists of,
(i) more than 30, preferably 40 to 98.5, preferably 50 to 98.5, preferably 60 to 98, preferably 70 to 98, wt % of a polymer of propylene (PP),
(ii) 1 to 20, preferably 2 to 18, more preferably 3 to 15, wt % of a flame retardant comprising an inorganic derivative of Phosphor,
(iii) 1 to 30, preferably 2 to 20, preferably 3 to 15, wt % of a filler,
(iv) 0.2 to 5, preferably 0.3 to 4.5, more preferably 0.4 to 4, wt % of an additive(s) other than the flame retardant product (ii),
(v) 0 to 30, preferably 0 to 20, preferably 0 to 18, more preferably 0 to 15, wt % of a plastomer, and
(vi) 0 to 30, preferably 0 to 20, preferably 0 to 15, wt % further polymer(s) other than (i) or (v);
based on the total amount (100 wt %) of the polymer composition, as defined above or below or in claims.

The invention further provides a backsheet layer element of a photovoltaic module as the article of the invention, wherein the backsheet element is selected from
a backsheet monolayer element comprising the polymer composition of the invention, or
a backsheet multilayer element wherein at least one layer comprises the polymer composition of the invention; as defined above or below or in claims.

As well known, the elements and the layer structure of the photovoltaic module of the invention can vary depending on the desired type of the module. The photovoltaic module can be rigid or flexible. The rigid photovoltaic module can for example contain a rigid protective front layer element, such as a glass element, a front encapsulation layer element, a photovoltaic layer element, a rear encapsulation layer element, a backsheet layer element which can be rigid or flexible; and optionally e.g. an aluminium frame. In flexible modules all the above elements are flexible, whereby the protective front and back as well as the front and rear encapsulation layer elements are typically based on polymeric layer elements.

Moreover, any of the above layer elements of the PV module can be a monolayer element or a multilayer element. The optional protective cover can be e.g. a metal frame, such as aluminium frame (with junction box).

A backsheet monolayer element can be produced by extrusion, e.g. by cast or blown film extrusion. A backsheet multilayer element of the invention can be produced by laminating the layers thereof. As a result, a laminated backsheet multilayer element is obtained. Alternatively, a backsheet multilayer element of the invention can be produced by extruding the layers thereof, e.g. by (co)extrusion. It is also possible that the part of the layers of the backsheet multilayer element of the invention are laminated and part of the layers are e.g. (co)extruded, i.e the backsheet multilayer element is a combination of laminated and (co)extruded layers. The (co)extrusion means herein cast extrusion or coextrusion.

Preferably, the layer of the backsheet monolayer element or the layers of the backsheet multilayer element of the photovoltaic module of the invention is/are free from fluoride containing polymer.

Preferably, said at least one layer of the layer element of the PV module as the article of the invention comprises at least 70 wt %, preferably at least 80 wt %, preferably at least 90 wt %, preferably 90 to 100 wt %, preferably consists of, the polymer composition of the invention.

As an example, the thickness of the mono- or multilayer element of the PV module of the invention, preferably of the backsheet mono- or multilayer element of the invention, is preferably 0.1 to 2.0 mm, preferably 0.15 to 2.0, mm.

Moreover, as an example only, the thickness of the at least one layer of the layer element can be 10.0 to 400 µm.

The above photovoltaic module may have further layer element(s) in addition to above mentioned elements. Moreover, the layers of the optional multilayer elements of the invention and of the further layer element(s) may also comprise adhesive layers for improving the adhesion of the layers of the multilayer element. There can be adhesive layers also between the different layer elements. Preferably there are no adhesive layers between the optional multilayer element of the invention.

The optional glass sheets as the protective front layer element, the photovoltaic layer element, which is preferably element(s) of photovoltaic cells together with connectors, and materials for layers for the front and rear encapsulation element(s) and/or for the backsheet element, when comprising other components than the polymer composition of the invention, are e.g. well-known in the photovoltaic module field and are commercially available or can be produced according to or in accordance with the methods known in the literature for the photovoltaic module field.

The photovoltaic module of the invention can be produced in a manner well known in the field of the photovoltaic modules. The polymeric layer(s) of the different elements can be produced e.g. by lamination or by extrusion, or by combination of lamination and extrusion, in a conventional manner using the conventional extruder and/or lamination equipment, as well-known for a skilled person.

The different elements of the photovoltaic module are typically assembled together by conventional means to produce the final photovoltaic module. Elements can be provided separately or partly in integrated form to such assembly step. The different elements are then typically attached together by lamination using the conventional lamination techniques in the field, as well-known for a skilled person.

The assembly of photovoltaic module is well-known in the field of photovoltaic modules.

FIG. 1 is a schematic picture of a typical PV module of the invention comprising a protective front layer element (1), a front encapsulation layer element (2), a photovoltaic layer element (3), a rear encapsulation layer element (4) and a backsheet layer element (5), wherein the backsheet layer element comprises the layer element of the invention as defined above or in below claims.

Determination Methods

Melt Flow Rate: The melt flow rate (MFR) is determined according to ISO 1133 and is indicated in g/10 min. The MFR is an indication of the flowability, and hence the processability, of the polymer. The higher the melt flow rate, the lower the viscosity of the polymer. The $MFR_2$ of polypropylene is measured at a temperature 230° C. and a load of 2.16 kg. The $MFR_2$ of polyethylene is measured at a temperature 190° C. and a load of 2.16 kg Density: ISO 1183, measured on compression moulded plaques Comonomer content: The comonomer content was determined by quantitative Fourier transform infrared spectroscopy (FTIR) after basic assignment calibrated via quantitative $^{13}C$ nuclear magnetic resonance (NMR) spectroscopy in a manner well known in the art. Thin films are pressed to a thickness of between 100-500 micrometer and spectra recorded in transmission mode.

Specifically, the ethylene content of a polypropylene-co-ethylene copolymer is determined using the baseline corrected peak area of the quantitative bands found at 720-722 and 730-733 $cm^{-1}$. Specifically, the butene or hexene content of a polypropylene copolymer is determined using the baseline corrected peak area of the quantitative bands found at 1377-1379 $cm^{-1}$. Quantitative results are obtained based upon reference to the film thickness.

The comonomer content is herein assumed to follow the mixing rule (equation 2):

$$C_b = w_1 \cdot C_1 + w_2 \cdot C_2 \qquad \text{(eq.2)}$$

Where C is the content of comonomer in weight-%, w is the weight fraction of the component in the mixture and subscripts b, 1 and 2 refer to the overall mixture, component 1 and component 2, respectively.

As it is well known to the person skilled in the art the comonomer content in weight basis in a binary copolymer can be converted to the comonomer content in mole basis by using the following equation $$c_m = \frac{1}{1 + \left(\frac{1}{c_w} - 1\right) \cdot \frac{MW_c}{MW_m}} \qquad \text{(eq. 3)}$$

where $c_m$ is the mole fraction of comonomer units in the copolymer, $c_w$ is the weight fraction of comonomer units in the copolymer, $MW_c$ is the molecular weight of the comonomer (such as ethylene) and $MW_m$ is the molecular weight of the main monomer (i.e., propylene).

Melting temperature ($T_m$) and heat of fusion ($H_f$): measured with Mettler TA820 differential scanning calorimetry (DSC) on 5 to 10 mg samples. DSC is run according to ISO 3146/part 3/method C2 in a heat/cool/heat cycle with a scan rate of 10° C./min (heating and cooling) in the temperature range of +23 to +210° C. The melting temperature and heat of fusion ($H_f$) are determined from the second heating step. The melting temperatures were taken as the peaks of endotherms.

Flexural Modulus: The flexural modulus was determined according to ISO 178. The test specimens having a dimension of 80×10×4.0 $mm^3$ (length×width×thickness) were prepared by injection molding according to EN ISO 1873-2. The length of the span between the supports was 64 mm, the test speed was 2 mm/min and the force was 100 N.

Xylene cold soluble (XCS): The amount of xylene cold soluble fraction was determined according to ISO 16152. The amount of polymer which remains dissolved at 25° C. after cooling is given as the amount of xylene soluble polymer. The content of xylene soluble polymer is herein assumed to follow the mixing rule (equation 4):

$$XS_b = w_1 \cdot XS_1 + w_2 \cdot XS_2 \qquad \text{(eq. 4)}$$

Where XCS is the content of xylene soluble polymer in weight-%, w is the weight fraction of the component in the mixture and subscripts b, 1 and 2 refer to the overall mixture, component 1 and component 2, respectively.

Vicat softening temperature: measured according to ASTM D 1525 method A (50° C./h, 10 N).

Heat Deflection Temperature (HDT): was measured according to ISO 75-2. The test specimens having a dimension of 80×10×4.0 $mm^3$ (length×width×thickness) were prepared by injection molding according to EN ISO 1873-2. The test specimen is loaded in three-point bending in the flatwise direction (support span: 64 mm). The outer fiber stress used for testing is 0.45 MPa (Method B). The Temperature is raised with constant heating rate of 120 K/h. The HDT is the temperature at which the bending of the test-specimen reaches a flexural strain increase of 0.2%.

Coefficient of linear thermal expansion (CLTE): The coefficient of linear thermal expansion (CLTE) was determined in accordance with ISO 11359-2:1999 on 10 mm long pieces cut from the same injection molded specimens as used for the flexural modulus determination. The measurement was performed in machine direction (MD) in a temperature range from −30 to +80° C. at a heating rate of 1° C./min.

Tensile Modulus; Tensile Strength:

Monolayer film samples: are prepared as prepared below under "Film preparation" specified below and measured according to ISO 527-3 using the below given conditions.

Monolayer Film preparation: 200 or 250 µm cast films were prepared, as identified in the context, on a Plastic Maschinenbau extruder with 3 heating zones equipped with a PP screw with a diameter of 30 mm, a 200 mm die with a die gap of 0.5 mm. The melt temperature of 250° C. and a chill roll temperature of 40° C. were used Film samples (200 or 250 µm monolayer as identified in the context): Before the first test, the film sample must be stored at 23° C./50% RH over a period of 96 hours. The test specimen shall be cut with a film cutter so that the edges are smooth, free from notches and have an exact width. The form of test specimen is a strip 15 mm wide and not less than 150 mm long. The specimens were cut in machine direction (MD).

Test conditions film tensile test: The test is performed according to ISO 527-3 using the following test condition set:

Test conditions: 23° C./50% RH
Preload: app. 0.2 N
Speed of preload: 2 mm/min
Speed of E-Modulus: 1 mm/min
Speed of testing: 200 mm/min
Clamping distance: 100 mm
Start of E-Modulus testing: 0.05%
End of E-Modulus testing: 0.25%.
UL 94 Thin Material Vertical Burning Test The above mentioned 200 and 250 μm films were tested according to UL94 test, chapter 11. 200×50 mm specimens were rolled to tubular and conical form (around a 13 mm diameter mandrel) according to the testing procedure. 5 samples each were tested, and 3 seconds flame was applied 2 times on each sample. Afterflame times were recoded, as well as, whether the specimens burn up to 125 mm mark. Also dripping behavior and especially the presence of burning particles igniting cotton indicator was rated. Samples were classified VTM-0, VTM-2 and fail as described in the standard.

Experimental Part

Polymerisation process of the components heterophasic copolymer of propylene (A) (referred below as iPP (A) below examples of tables).

Catalyst Preparation:

Catalyst Preparation for iPP (A) Component:

First, 0.1 mol of $MgCl_2 \times 3$ EtOH was suspended under inert conditions in 250 ml of decane in a reactor at atmospheric pressure. The solution was cooled to the temperature of −15° C. and 300 ml of cold $TiCl_4$ was added while maintaining the temperature at said level. Then, the temperature of the slurry was increased slowly to 20° C. At this temperature, 0.02 mol of diethylhexylphthalate (DOP) was added to the slurry. After the addition of the phthalate, the temperature was raised to 135° C. during 90 minutes and the slurry was allowed to stand for 60 minutes. Then, another 300 ml of $TiCl_4$ was added and the temperature was kept at 135° C. for 120 minutes. After this, the catalyst was filtered from the liquid and washed six times with 300 ml heptane at 80° C. Then, the solid catalyst component was filtered and dried. Catalyst and its preparation concept is described in general e.g. in patent publications EP 491 566, EP 591 224 and EP 586 390.

Then triethylaluminium (TEAL), dicyclopentyldimethoxysilane (DCPDMS) as donor (Do), catalyst as produced above and vinylcyclohexane (VCH) were added into oil, like mineral oil, e.g. Technol 68 (kinematic viscosity at 40° C. 62-74 cSt), in amounts so that Al/Ti was 3-4 mol/mol, Al/Do was as well 3-4 mol/mol, and weight ratio of VCH/solid catalyst was 1:1.

The mixture was heated to 60-65° C. and allowed to react until the content of the unreacted vinylcyclohexane in the reaction mixture was less than 1000 ppm. Catalyst concentration in the final oil-catalyst slurry was 10-20 wt %.

Polymerisation Examples

All Pilot scale polymers were produced with a prepolymerisation reactor, one slurry loop reactor and two gas phase reactors.

Catalyst Feeding

Catalyst was fed continuously to the polymerisation in oil slurry by the piston pump.

Co-Catalyst and Donor

Triethylaluminium (TEAL) was used as a co-catalyst and dicyclopentyldimethoxysilane (Donor D) was used as an external donor. Actual TEAL and donor feeds are given in table 1.

Prepolymerisation Reactor

The catalyst was flushed with propylene to the prepolymerisation reactor in which also TEAL and D-donor were fed. Prepolymerisation reactor, CSTR was operated at 30° C. and 55 barg pressure. The residence time of the particles in propylene slurry was about 0.38 h.

Loop Reactor

The prepolymerised catalyst component was used in loop reactor and gas phase reactors (GPR) connected in series. The process conditions for the loop reactor are given in table 1.

Gas Phase Reactor 1

Polymer slurry was fed from loop to the gas phase reactor (GPR1) as a direct feed without flash. GPR operating temperatures and pressures are given in table 1.

Gas Phase Reactor 2

The product was transferred from GPR1 to GPR2 as an indirect feed via a flash tank. GPR operating temperatures and pressures are given in table 1.

Product Control

The production split between loop and GPR was controlled to be close to 50/50%. The MFR (2.16 kg/230° C.) was controlled by hydrogen feed.

Final iPP (A) Component

The polymer powder obtained from GPR2 was further melt homogenised and pelletized using a Coperion ZSK57 co-rotating twin screw extruder with screw diameter 57 mm and L/D 22. Screw speed was 200 rpm and barrel temperature 200-220° C.

For iPP (A), the following additives were added during the melt homogenisation step: 1500 ppm ADK-STAB A-612 (supplied by Adeka Corporation) and 300 ppm Synthetic hydrotalcite (ADK STAB HT supplied by Adeka Corporation).

TABLE 1

| Polymerisation conditions | |
|---|---|
| | iPP (A) |
| TEAL/Ti [mol/mol] | 78 |
| TEAL/Donor [mol/mol] | 12 |
| TEAL/C3 [g/t] | 180 |
| Donor/C3 [g/t] | 30 |
| Prepolymerisation | |
| B1 Temperature [° C.] | 30 |
| Loop | |
| B2 Temperature [° C.] | 85 |
| B2 Pressure (barg) | 55 |
| B2 H2/C3 ratio [mol/kmol] | 1.4 |
| B2 Split [%] | 43.7 |
| GPR1 | |
| B3 Temperature [° C.] | 85 |
| B3 Pressure (barg) | 23 |
| B3 H2/C3 ratio (mol/kmol) | 17 |
| B3 split [%] | 43.7 |
| GPR2 | |
| B4 Temperature (° C.) | 71 |
| B4 Pressure (barg) | 17 |
| B4 C2/C3 ratio [mol/kmol] | 480 |
| B4 H2/C2 ratio [mol/kmol] | 460 |
| B4 split [%] | 12.6 |
| Final product | |
| $MFR_2$ [g/10 min] | 3 |
| Ethene comonomer content [wt. %] | 3.6 |
| XCS [wt. %] | 14 |
| Melting temp., Tm [° C.] | 165 |
| Vicat A [° C.] | 154 |
| Density [kg/m³] | 905 |
| Flexural modulus | 1400 |

Further Components of the Inventive and Comparative PP Polymer Compositions:

Plastomer 1: Queo 8203, supplier Borealis, is an ethylene based octene plastomer, produced in a solution polymerisation process using a metallocene catalyst, MFR$_2$ (190° C.) of 3.0 g/10 min and density of 882 kg/m$^3$.

FR1: Phoslite B404AF, supplied by Italmatch Chemicals (inorganic phosphor based FR of the invention)

FR2: MAGNIFIN H 5 HV, supplier Albemarle (magnesium hydroxide based FR)

FR3: Flamestab NOR 116, supplied by BASF (Cas: 191680-81-6, 1,3-Propanediamine,N1,N1'-1,2-ethanediylbis-, reaction products with cyclohexane and peroxidizedN-butyl-2,2,6,6-tetramethyl-4-piperidinamine-2,4,6-trichloro-1,3,5-triazinereaction products)

Filler 1: Wollastonite 1: a commercially available wollastonite product with aspect ratio 7:1

Filler 2: Wollastonite 2: a commercially available wollastonite product with aspect ratio 9:1

Filler 3: Glass fibres: a commercially available product with 13 μm fibre diameter.

Filler 4: Talc 1: a commercial product with median particle size D50 of <2 μm

Filler 5: Talc 2: a commercial product with median particle size D50 of <3 μm

Preparation of the inventive and comparative PP polymer compositions. The compositions were prepared by compounding the polymers with the other components and conventional additives on a co-rotating twin-screw extruder (ZSK32, Coperion) using a screw speed of 400 rpm and a throughput of 90-100 kg/h. The melt temperature ranged from 190-220° C. The components and the amounts thereof are given below under table 2. The IE1 and IE2 were compounded in two steps to enable good dispersion of glass fibres. Same extruder was used, in first step only iPP (A) together with glass fibre was compounded. In second extrusion stage flame retardant was added.

The reference comparative compositions CE1 to CE2 are identified in table 2 below.

conventional laminator, heated under vacuum, and then pressed to a PV module in a conventional manner using conventional conditions.

The front glass material, photovoltaic cell element and EVA material of front and back encapsulation (same EVA in both layer elements) were those conventionally used in the PV field.

The invention claimed is:

1. A photovoltaic module comprising at least one photovoltaic element and at least one layer element, wherein said layer element comprises at least one layer comprising a polypropylene composition comprising:
   (i) 50 to 98.5 wt % of a polymer of propylene (PP), wherein the polymer of propylene (PP) is a heterophasic copolymer of propylene (iPP) which comprises a heterophasic copolymer of propylene (A) which comprises a polypropylene matrix component (a1) and an elastomeric propylene copolymer component (a2) which is dispersed in said polypropylene matrix (a1); and wherein the heterophasic copolymer of propylene (A) has a melting temperature (Tm) (DSC) of at least 145° C.; a Vicat softening temperature (Vicat A) of at least 90° C. (according to ASTM D 1525, method A, 50° C./h, 10 N); and a MFR2 of 0.2 to 20.0 g/10 min, when measured according to ISO 1133 (at 230° C. and 2.16 kg load);
   (ii) 1 to 18 wt % of a flame retardant product comprising at least 60 wt % of a metal salt of phosphinic acid,
   (iii) 1 to 20 wt % of a filler selected from talc or wollastonite,
   (iv) 0.2 to 5 wt % of an additive(s) other than the flame retardant product (ii), and
   (v) 0 to 30 wt % of a plastomer;
   based on the total amount (100 wt %) of the polypropylene composition;

TABLE 2

Inventive PP polymer compositions IE1 to IE6 and comparative PP compositions CE1 to CE2

| Composition: | unit | IE1 | IE2 | IE3 | IE4 | IE5 | IE6 | CE1 | CE2 |
|---|---|---|---|---|---|---|---|---|---|
| iPP (A) | wt.-% | 82 | 89 | 82 | 84 | 82 | 73 | 94 | 54 |
| Plastomer 1 | wt.-% | | | | | | 7 | | |
| Filler 1 | wt.-% | | | 10 | | | | | |
| Filler 2 | wt.-% | | | | 8 | | 10 | | |
| Filler 3 | wt.-% | 10 | 5 | | | | | | |
| Filler 4 | wt.-% | | | | | 10 | | | |
| Filler 5 | wt.-% | | | | | | | | 10 |
| FR1 | wt.-% | 8 | 6 | 8 | 8 | 8 | 10 | 6 | |
| FR2 | wt.-% | | | | | | | | 35 |
| FR3 | wt.-% | | | | | | | | 1 |
| Data for IM specimen: | | | | | | | | | |
| Flexural modulus | MPa | 2209 | 1812 | 1944 | 2147 | 2008 | 1999 | 1494 | n.m. |
| CLTE, MD(−30° C./+80° C.) | μm/m/° C. | 55.9 | 69.0 | 69.8 | 61.6 | 77.1 | 62.3 | 95.3 | n.m. |
| HDT (B, 0.45 MPa) | ° C. | 134.6 | 121.4 | 101.5 | 104.2 | 103.6 | 96.4 | 94.3 | n.m. |
| Vicat (A50) | ° C. | 156.1 | 155.8 | 154.4 | 153.8 | 154.9 | 149 | 153.7 | n.m. |
| Data for films: | | | | | | | | | |
| Film thickness | μm | 200 | 200 | 200 | 200 | 200 | 200 | 200 | 250 |
| Tensile Modulus MD | MPa | 2172 | 1667 | 1644 | 1811 | 1687 | 1706 | 1230 | 2919 |
| Tensile strength MD | MPa | 29 | 27 | 26 | 27 | 28 | 26 | 28 | 23 |
| UL-94 | — | VTM-0 | VTM-0 | VTM-0 | VTM-0 | VTM-0 | n.m. | VTM-0 | Fail |
| visual film appearance | — | good | good | excellent | excellent | excellent | excellent | excellent | good | n.m. not measured

PV-Module Example

Protective front glass element, front EVA-encapsulation layer element, photovoltaic cell element together with connectors, back EVA-encapsulation layer element and monolayer backsheet of the invention of IE5 were assembled in a wherein the layer element is a film which has a thickness of 0.02 to 2.00 mm.

2. The photovoltaic module according to claim 1, wherein the metal salt of phosphinic acid of the flame retardant product (ii) is selected from the group consisting of an aluminum salt of phosphinic acid.

3. The photovoltaic module according to claim 1, wherein the polypropylene composition comprises,
(i) 60 to 98 wt % of a polymer of propylene (PP),
(ii) 1 to 18 wt % of a flame retardant product comprising a metal salt of phosphinic acid,
(iii) 1 to 20 wt % of a filler,
(iv) 0.2 to 5 wt % of an additive(s) other than the flame retardant product (ii),
(v) 0 to 30 wt % of a plastomer, and
(vi) 0 to 30 wt % further polymer(s) other than (i) or (v); based on the total amount (100 wt %) of the polypropylene composition.

4. The photovoltaic module according to claim 1, wherein the polypropylene composition comprises,
(i) 60 to 98 wt % of a polymer of propylene (PP),
(ii) 1 to 18 wt % of a flame retardant product comprising a metal salt of phosphinic acid,
(iii) 1 to 20 wt % of a filler,
(iv) 0.2 to 5 wt % of an additive(s) other than the flame retardant product (ii),
(v) 3 to 30 wt % of a plastomer, and
(vi) 0 to 30 wt % further polymer(s) other than (i) or (v); based on the total amount (100 wt %) of the polypropylene composition.

5. The photovoltaic module according to claim 1, wherein the polypropylene composition has one or more, in any order and in any combination of the following properties:
a Vicat softening temperature (Vicat A) of 100 to 200° C.,
a flexural modulus of 1100 to 3000 MPa,
a coefficient linear thermal expansion (CLTE) of 100 or less μm/m/° C., when measured from an injection moulded sample at temperature range from −30° C. to +80° C. and at heating rate of 1° C./min, and/or
a heat deflection temperature (HDT) of 75° C. or more.

6. The photovoltaic module according to claim 1, wherein the heterophasic copolymer of propylene (A) has one or more, in any order and in any combination of the following properties:
MFR2 of 0.2 to 15.0 g/10 min when measured according to ISO 1133 (at 230° C. and 2.16 kg load),
a xylene cold soluble (XCS) fraction in amount of 3 to 30 wt %,
a comonomer content of 0.5 to 20 wt %, the comonomer(s) is selected from ethylene and/or C4-C8 alpha olefin comonomers,
a flexural modulus of at least 900 MPa, when measured according to ISO178, and/or
a density of 900 to 910 kg/m3.

7. The photovoltaic module according to claim 1, wherein the layer element is selected from:
a monolayer element comprising the polypropylene composition, or
a multilayer element wherein at least one layer comprises the polypropylene composition.

8. The photovoltaic module according to claim 1, wherein the layer element is a film selected from:
a monolayer film comprising the polypropylene composition, or
a multilayer film wherein at least one layer comprises the polypropylene composition.

9. The photovoltaic module according to claim 1, comprising, in the given order, a protective top layer element, a front encapsulation layer element, at least one photovoltaic layer element, a rear encapsulation layer element, a backsheet layer element and optionally a protective cover, wherein at least one of said layer elements comprises the layer element comprising said polypropylene composition.

10. The photovoltaic module according to claim 1, wherein the layer element is a backsheet layer element selected from:
a backsheet monolayer element comprising the polypropylene composition, or
a backsheet multilayer element wherein at least one layer comprises the polypropylene composition.

* * * * *